(12) United States Patent
Kayano et al.

(10) Patent No.: US 7,248,846 B2
(45) Date of Patent: Jul. 24, 2007

(54) FEEDFORWARD AMPLIFIER AND RADIO COMMUNICATION APPARATUS WITH THE AMPLIFIER

(75) Inventors: Hiroyuki Kayano, Fujisawa (JP); Yuta Araki, Tokyo (JP); Yuuji Ohtsuka, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 355 days.

(21) Appl. No.: 10/765,871

(22) Filed: Jan. 29, 2004

(65) Prior Publication Data

US 2004/0192237 A1   Sep. 30, 2004

(30) Foreign Application Priority Data

Mar. 28, 2003 (JP) .............................. 2003-089802

(51) Int. Cl.
 H04B 1/04 (2006.01)
 H04B 17/00 (2006.01)
 H04B 1/16 (2006.01)

(52) U.S. Cl. .............................. 455/127.3; 455/127.5; 455/226.1; 455/343.1

(58) Field of Classification Search ............. 455/127.1, 455/127.2, 127.4, 127.5, 130, 137, 205, 276.1, 455/269, 277.2, 296, 341, 343.1, 127.3
See application file for complete search history.

(56) References Cited

U.S. PATENT DOCUMENTS 5,990,738 A * 11/1999 Wright et al. ............... 330/149
6,054,896 A * 4/2000 Wright et al. ............... 330/149
6,316,983 B1 * 11/2001 Kitamura ..................... 327/317
6,614,854 B1 * 9/2003 Chow et al. ................. 375/297
2002/0142790 A1 * 10/2002 Samelis et al. ............. 455/522
2003/0032397 A1 * 2/2003 Kuechler et al. ........... 455/127
2003/0100312 A1 * 5/2003 Takahashi ................... 455/453
2003/0162518 A1 * 8/2003 Baldwin et al. ......... 455/253.2

FOREIGN PATENT DOCUMENTS

JP      3-277003      12/1991
JP      4-54006       2/1992

(Continued)

OTHER PUBLICATIONS

Notifications of Reasons for Rejection mailed Apr. 11, 2006, from the Japanese Patent Office in Japanese Patent Application No. 2003-089802.

(Continued)

Primary Examiner—Tony T. Nguyen
(74) Attorney, Agent, or Firm—Finnegan, Henderson, Farabow, Garrett & Dunner, L.L.P.

(57) ABSTRACT

An amplifier comprises a first amplifier circuit which amplifies a first signal to output an amplified first signal, a circuit which outputs a second signal corresponding to a difference between the first signal and the amplified first signal, a second amplifier circuit which amplifies the second signal to output an amplified second signal, a combine circuit which outputs an amplified signal by combining the amplified second signal with the amplified first signal, and a controller which controls a supply of a power to the first amplifier circuit and the second amplifier circuit and has a first mode to supply the power to the second amplifier circuit without supplying the power to the first amplifier circuit.

17 Claims, 9 Drawing Sheets

FOREIGN PATENT DOCUMENTS

| | | |
|---|---|---|
| JP | 10-200313 | 7/1998 |
| JP | 11-55045 | 2/1999 |
| JP | 2001-274632 | 10/2001 |
| JP | 2001-292067 | 10/2001 |
| JP | 2002-171135 | 6/2002 |
| JP | 2002-325020 | 11/2002 |

OTHER PUBLICATIONS

Decision of Rejection Issued by the Japanese Patent Office, mailed Dec. 19, 2006, In Japanese Application No. 2003-089802 and English translation of Decision.

* cited by examiner

| Cell size | Operation state of main amplifier | Operation state of error amplifier | Switch |
|---|---|---|---|
| Large cell | ON | ON | Contact "a" |
| Intermediate cell | ON | OFF | Contact "a" |
| Small cell | OFF | ON | Contact "b" |

FEEDFORWARD AMPLIFIER AND RADIO COMMUNICATION APPARATUS WITH THE AMPLIFIER

CROSS-REFERENCE TO RELATED APPLICATIONS

This application is based upon and claims the benefit of priority from the prior Japanese Patent Application No. 2003-089802, filed Mar. 28, 2003, the entire contents of which are incorporated herein by reference.

BACKGROUND OF THE INVENTION

1. Field of the Invention

The present invention relates to a feedforward amplifier used to amplify the power of a radio signal in, for example, a base station for a mobile communication system, and also relates to a radio communication apparatus equipped with a feedforward amplifier.

2. Description of the Related Art

Recent mobile communication systems employ a multi-value modulation scheme in light of effective use of a frequency band. A signal obtained by modulation using a multi-value modulation scheme contains information in its amplitude and phase. Accordingly, radio communication apparatuses that employ the multi-value modulation scheme always require a power amplifier having excellent linearity. A feedforward amplifier is known as such a power amplifier. If a feedforward amplifier is used, the signal in an adjacent or nearby channel can be suppressed to a predetermined power level or less.

A feedforward amplifier comprises, for example, an error amplifier and feedforward circuit. The feedforward circuit detects a distortion component contained in a radio signal output from a main amplifier incorporated in the feedforward circuit, and generates, based on the distortion component, a cancel signal that has the same amplitude as the radio signal and a phase opposite to that of the radio signal. This cancel signal is amplified by the error amplifier and then combined with the radio signal, thereby canceling the distortion component contained in the radio signal (see, for example, Jpn. Pat. Appln. KOKAI Publication No. 11-55045).

This feedforward amplifier is generally used when the maximum power is output.

However, in recent cellular communication systems, cell sizes are often varied in accordance with, for example, geographical features or traffic density. In accordance with the cell size, the radio communication apparatus used in a base station is required to vary the transmission power level. Further, the transmission power level of the radio communication apparatus may also be varied in accordance with the distance between the base station and a mobile station, regardless of cell size.

However, if the transmission power level of the radio communication apparatus is low, the level of the distortion component falls within the allowable range of the main amplifier of the feedforward amplifier. In other words, it is not necessary to use the error amplifier. Therefore, in this case, power is wastefully used for operating the unnecessary error amplifier.

In light of the above, it has been proposed to stop the supply of power to the error amplifier when the feedforward amplifier is driven with low power, thereby reducing the power consumption. However, in the feedforward amplifier, the power consumption of the main amplifier occupies the greater part of the whole power consumption. This means that even if the supply of power to the error amplifier is stopped, the total power consumption is not greatly reduced, and the recent demand for saving power is not sufficiently satisfied.

BRIEF SUMMARY OF THE INVENTION

The present invention has been developed in light of the above, and aims to provide a feedforward amplifier that operates at further reduced power consumption when a low-level signal is output, and a radio communication apparatus with the amplifier.

According to a first aspect of the invention, there is provided an amplifier comprising: a first amplifier circuit which amplifies a first signal to output an amplified first signal; a circuit which outputs a second signal corresponding to a difference between the first signal and the amplified first signal; a second amplifier circuit which amplifies the second signal to output an amplified second signal; a combine circuit which outputs an amplified signal by combining the amplified second signal with the amplified first signal; and a controller which controls a supply of a power to the first amplifier circuit and the second amplifier circuit and has a first mode to supply the power to the second amplifier circuit without supplying the power to the first amplifier circuit.

According to a second aspect of the invention, there is provided a feedforward amplifier comprising: a first amplifier circuit which amplifies a first signal to output an amplified first signal; a second amplifier circuit which amplifies a second signal to output an amplified second signal, the second signal corresponding to a difference between the first signal and the amplified first signal; and an output circuit which outputs an amplified signal selected from the amplified first signal, the amplified second signal and a combined signal reduced a distortion component from the amplified first signal by using the amplified second signal; wherein the feedforward amplifier has three operation modes comprised of a first mode to supply a power to the second amplifier circuit without supplying the power to the first amplifier circuit, a second mode to supply the power to the first amplifier circuit without supplying the power to the second amplifier circuit and a third mode to supply the power to the first amplifier circuit and the second amplifier circuit, and the output circuit outputs the amplified second signal in the first mode, the output circuit outputs the amplified first signal in the second mode and the output circuit outputs the combined signal in the third mode.

According to a third aspect of the invention, there is provided a radio communication apparatus comprising: an antenna; and a radio unit configured to supply, to the antenna, a signal output from the amplifier according to the first aspect, the radio unit including the amplifier.

According to a fourth aspect of the invention, there is provided a radio communication apparatus comprising: an antenna; and a radio unit configured to supply, to the antenna, a signal output from the feedforward amplifier according to the second aspect, the radio unit including the amplifier.

DETAILED DESCRIPTION OF THE INVENTION (First Embodiment)

Figure 1:
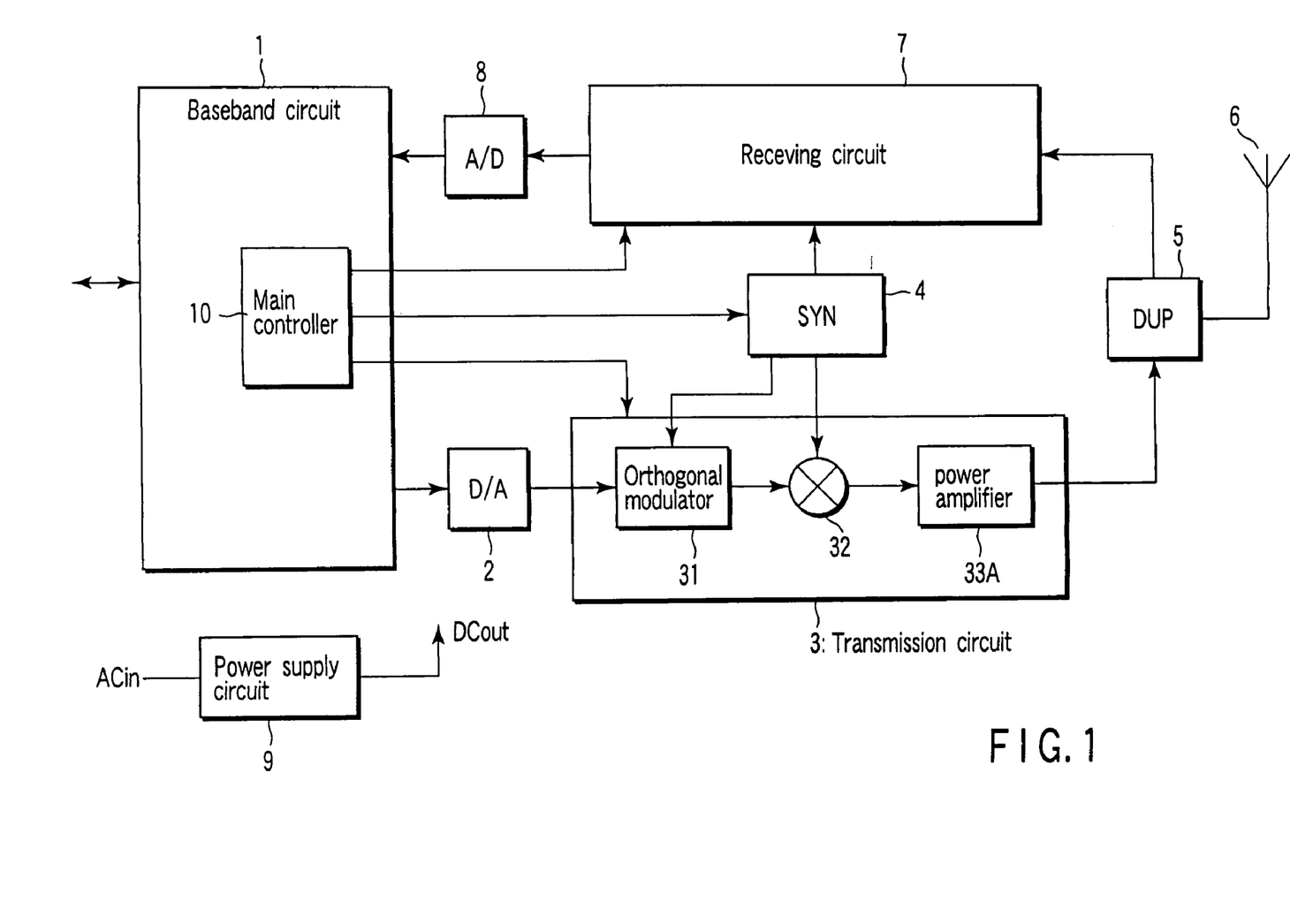
FIG. 1 is a block diagram illustrating the configuration of a radio communication apparatus equipped with a feedforward amplifier according to a first embodiment of the invention.

FIG. 1 is a block diagram illustrating the configuration of a radio communication apparatus provided in a mobile communication base station and equipped with a feedforward amplifier according to a first embodiment of the invention.

In FIG. 1, the data supplied from a wired communication network (not shown) is input to a baseband circuit 1, where it is subjected to encoding for compression, and to spread encoding for enabling communication using code-division multiple access (CDMA). The data (signal) obtained after spread encoding is converted into an analog signal by a digital-to-analog converter (DAC) 2, and then input to a transmission circuit 3.

The transmission circuit 3 comprises an orthogonal modulator 31, frequency converter 32 and power amplifier 33A. The analog data signal input to the circuit 3 is first subjected to orthogonal modulation in the orthogonal modulator 31, and then converted into a radio signal in the frequency converter 32. The frequency conversion is performed by mixing the modulation signal from the orthogonal modulator 31 with a transmission local oscillator signal generated by a frequency synthesizer (SYN) 4. The frequency of the transmission local oscillator signal generated by the synthesizer 4 is designated by a main controller 10. The level of the frequency-converted radio signal is increased to a predetermined transmission power level by the power amplifier 33A that is a feedforward amplifier, and then transmitted to a mobile station (not shown) from an antenna 6 via an antenna duplexer (DUP) 5.

On the other hand, the radio signal transmitted from a mobile station is received by the antenna 6, and then input to a receiving circuit 7 via the antenna duplexer 5. The receiving circuit 7 subjects the input radio signal to low-noise amplification, and then converts it into an intermediate-frequency reception signal. This frequency conversion is performed by mixing the radio signal with a reception local oscillation signal generated by the frequency synthesizer (SYN) 4. The frequency of the reception local oscillation signal generated by the synthesizer 4 is designated by the main controller 10, like the above-mentioned transmission local oscillation signal. The frequency-converted reception signal is then converted into a reception baseband signal by orthogonal demodulation, and further converted into a digital signal by an analog-to-digital converter (ADC) 8. The resultant digital signal is input to the baseband circuit 1.

The baseband circuit 1 incorporates a RAKE receiver. The RAKE receiver subjects multi-path reception signals contained in the input reception baseband signal to despread processing using a spread code, then performs symbol phase adjustment on the resultant signals and combines them. As a result, reception data is obtained. The reception data is decoded into data by a decoder, and transmitted to the previously mentioned, wired communication network.

Reference numeral 9 denotes a power supply circuit. The power supply circuit 9 generates a direct current output DCout from, for example, a commercial power supply input ACin, and supplies the output DCout to each circuit component of the radio communication apparatus.

Figure 2:
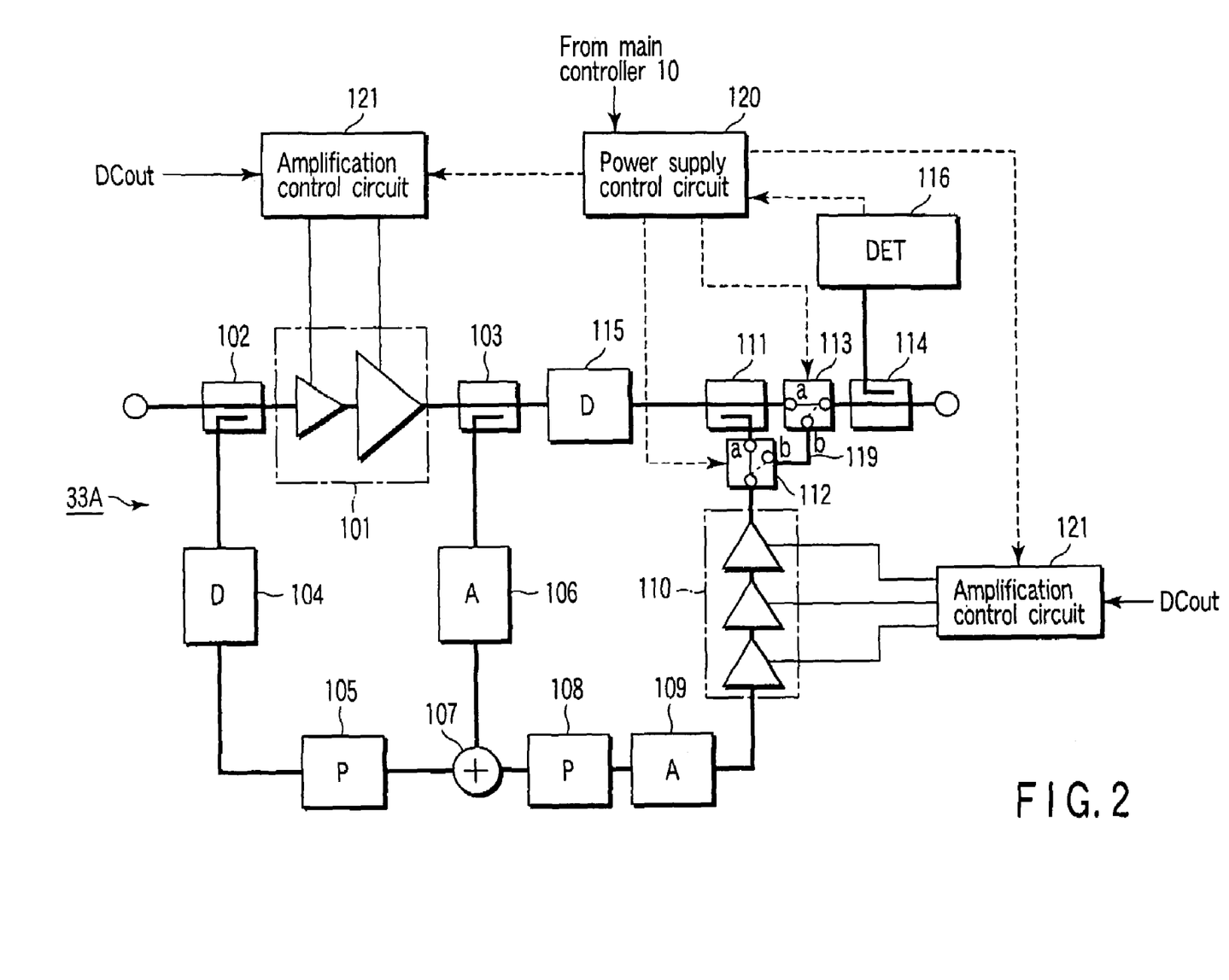
FIG. 2 is a block diagram illustrating the configuration of the feedforward amplifier incorporated in the radio communication apparatus of FIG. 1.

The power amplifier 33A has the configuration shown in FIG. 2.

As seen from FIG. 2, the amplifier 33A comprises a main amplifier 101 as a first amplifier circuit, an error amplifier 110 as a second amplifier circuit, and a feedforward circuit.

The feedforward circuit is formed of a main-signal cancel circuit unit and distortion cancel circuit unit. The main-signal cancel circuit unit adjusts the input and output signals of the main amplifier 101 so that they will have the same amplitude and opposite phases, and combines them, thereby detecting a signal corresponding to the difference between the input and output signals, i.e., a distortion component contained in the output signal.

Specifically, part of the radio signal to be input to the main amplifier 101 is branched by a directional coupler 102, delayed by a delay circuit 104 by a certain length of time, and phase-inverted by a phase adjusting circuit 105. Further, part of the radio signal output from the main amplifier 101 is branched by a directional coupler 103, and the amplitude of the branched signal is adjusted by an amplitude adjusting circuit 106. The phase-adjusted signal and amplitude-adjusted signal are combined by a synthesizer 107, thereby extracting the above-mentioned distortion component.

The distortion cancel circuit unit adjusts the distortion component extracted by the main-signal cancel circuit unit, and the output signal of the main amplifier 101, so that they have the same amplitude but opposite phases, and then combines the adjusted signals to cancel the distortion component.

Specifically, the distortion component, output from the synthesizer circuit 107 of the main-signal cancel circuit unit, is phase-inverted by the phase adjusting circuit 108, then amplitude-adjusted by the amplitude adjusting circuit 109 and amplified into a cancel signal by the error amplifier 110. The delay of the cancel signal is adjusted by a delay circuit 115 and combined with the output signal of the main amplifier 101 by a directional coupler 111. As a result, the discharge component contained in the output signal of the main amplifier 101 is canceled.

The power amplifier 33A further comprises a switching circuit, detection circuit (DET) 116, amplification control circuit 120 and power supply control circuit 121.

The switching circuit is formed of a first switch 112 interposed between the output terminal of the error amplifier 110 and directional coupler 111, a second switch 113 interposed between the directional coupler 111 and the output terminal of the power amplifier 33A, a bypass line 119 that connects the first and second switches 112 and 113, bypassing the directional coupler 111. The first and second switches 112 and 113 perform respective switching operations in accordance with a switch control signal output from the amplification control circuit 120.

The detection circuit 116 detects the amplitude of the amplified part of the radio signal, extracted by a directional coupler 114, and supplies the detected amplitude to the amplification control circuit 120.

The amplification control circuit 120 generates a power supply control signal and a switch control signal on the basis of an amplification mode designating signal output from the main controller 10 of the baseband circuit 1, and the detected amplitude output from the detection circuit 116. The circuit 120 supplies the generated power supply control signal and the generated switch control signal to the power supply control circuit 120 and first and second switches 112 and 113.

The power supply control circuit 121 performs ON/OFF control of the supply of the direct current output DCout to the main amplifier 101 and error amplifier 110, in accordance with the power supply control signal output from the amplification control circuit 120.

A description will now be given of the operation of the power amplifier 33A and that of the radio communication apparatus with the power amplifier 33A.

For example, when establishing a base station, an engineer designates and inputs an operation mode for the radio communication apparatus of the base station in accordance with the cell size to be covered by the base station. The operation mode includes a large cell mode corresponding to a large cell with a diameter of, for example, a few kilometers, an intermediate cell mode corresponding to a cell smaller than the large cell, and a small cell mode corresponding to a cell smaller than the intermediate cell.

When the operation mode is input, the main controller 10 of the radio communication apparatus controls the gain of a variable gain amplifier (not shown) so that the transmission power level of the radio signal corresponds to the cell diameter designated by the input operation mode. At the same time, the main controller 10 supplies the amplification control circuit 120 of the power amplifier 33A with an amplification mode designation signal corresponding to the above-mentioned cell diameter.

Figure 3:
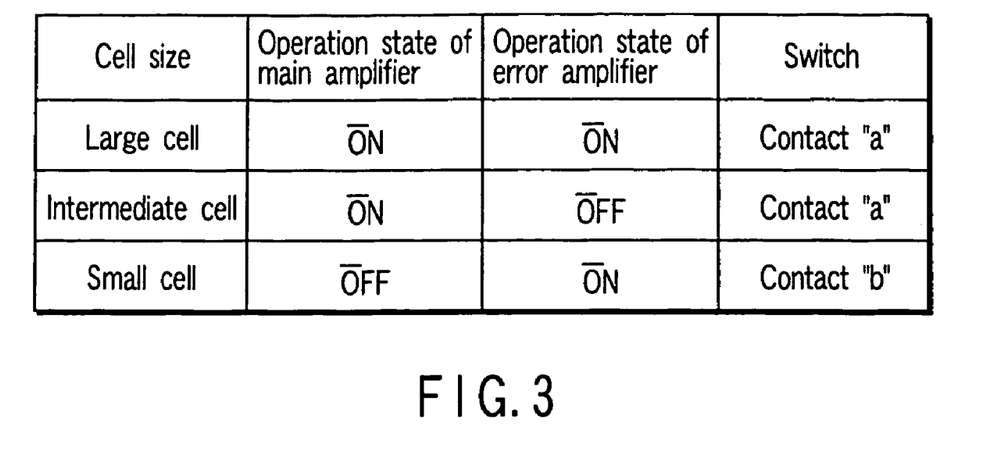
FIG. 3 illustrates the contents of control performed by the amplification control circuit of the feedforward amplifier of FIG. 2.

In accordance with the supplied amplification mode designation signal, the amplification control circuit 120 of the power amplifier 33A controls the supply of power to the main amplifier 101 and error amplifier 110 and the states of the switches 112 and 113. FIG. 3 shows the contents of control.

For example, if the supplied amplification mode designation signal corresponds to the large cell, the amplification control circuit 120 supplies the power supply control circuit 121 with a power supply control signal for setting both the main amplifier 101 and error amplifier 110 in the operation state, as shown in FIG. 3. The power supply control circuit 121, in turn, supplies the direct current power supply output DCout to the main amplifier 101 and error amplifier 110, with the result that the main amplifier 101 and error amplifier 110 operate. The amplifier control circuit 120 further controls the switches 112 and 113 so that their movable contacts are connected to respective stationary contacts "a".

Figure 5:
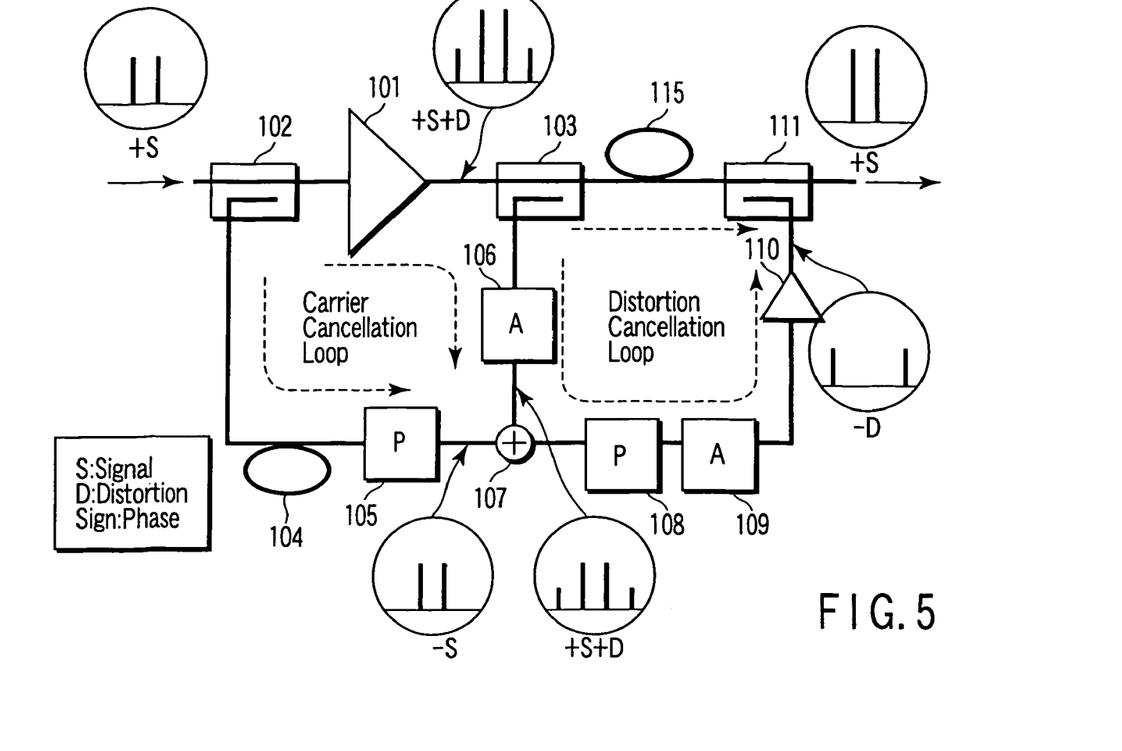
FIG. 5 illustrates an equivalent circuit used to explain the operation of the feedforward amplifier of FIG. 2.

Accordingly, the radio signal input to the power amplifier 33A that assumes the above-described state is amplified by the main amplifier 101, then coupled with the cancel signal from the error amplifier 110 by the directional coupler 111, and output as a radio signal that has its distortion component canceled and has power corresponding to the large cell. FIG. 5 shows an equivalent circuit useful in explaining the operation of the power amplifier 33A in this state.

On the other hand, if the supplied amplification mode designation signal corresponds to the intermediate cell, the amplification control circuit 120 performs the following control. As shown in FIG. 3, the control circuit 120 supplies the power supply control circuit 121 with a power supply control signal for setting the main amplifier 101 in the operation state and the error amplifier 110 in the non-operation state, as shown in FIG. 3. Accordingly, the power supply control circuit 121 supplies the direct current power supply output DCout to the main amplifier 101, and does not supply it to the error amplifier 110. As a result, the main amplifier 101 operates, and the error amplifier 110 does not operate. The amplifier control circuit 120 further controls the switches 112 and 113 so that their movable contacts are connected to the respective stationary contacts "a".

Figure 6:
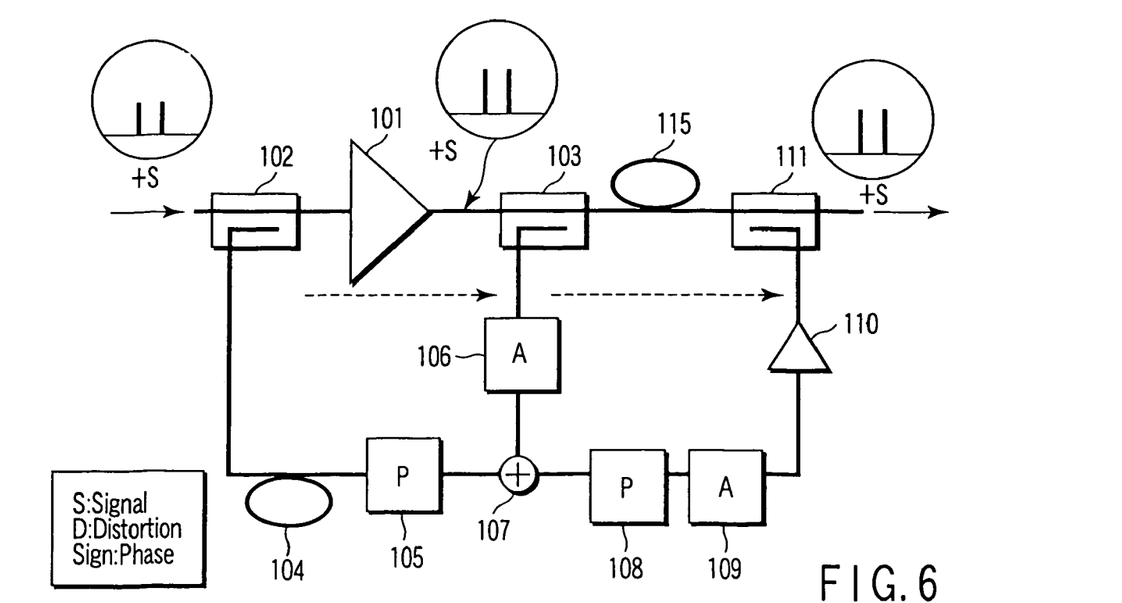
FIG. 6 illustrates another equivalent circuit used to explain the operation of the feedforward amplifier of FIG. 2.

Accordingly, the radio signal input to the power amplifier 33A that assumes the above-described state is amplified by the main amplifier 101 and output as a radio signal that has its distortion component maintained and has power corresponding to the intermediate cell. FIG. 6 shows an equivalent circuit useful in explaining the operation of the power amplifier 33A in this state.

In this case, although the distortion component is not canceled, there is a very low possibility of the transmitted radio signal interfering with an adjacent or nearby channel. This is because when the transmission power level of a radio signal is low, the level of the distortion component of the signal falls within the allowable range of the main amplifier.

Furthermore, if the supplied amplification mode designation signal corresponds to the small cell, the amplification control circuit 120 performs the following control. As shown in FIG. 3, the control circuit 120 sets the main amplifier 101 in the non-operation state, and supplies the power supply control circuit 121 with a power supply control signal for setting the error amplifier 110 in the operation state, as shown in FIG. 3. Accordingly, the power supply control circuit 121 supplies no power output to the main amplifier 101, but supplies the direct current power supply output DCout to the error amplifier 110. As a result, the main amplifier 101 does not operate and the error amplifier 110 operates. The amplifier control circuit 120 further controls the switches 112 and 113 so that their movable contacts are connected to the respective stationary contacts "b".

In this state, since the main amplifier 101 does not operate, the radio signal input to the power amplifier 33A is input to the error amplifier 110 via part of the feedforward circuit, where it is amplified. The radio signal amplified by the error amplifier 110 is transmitted, via the switches 112 and 113, as a radio signal of power corresponding to the small cell. In other words, in the case of the small cell, only the error amplifier 110 operates, which significantly reduces the power consumption of the power amplifier 33A.

Moreover, the radio signal output from the error amplifier 110 is output through the bypass line 119, i.e., bypassing the directional coupler 111. Accordingly, the radio signal output from the error amplifier 110 is transmitted without being attenuated by the directional coupler 111. This means that the amplification gain of the error amplifier 110 can be set lower to further reduce the power consumption.

Figure 7:
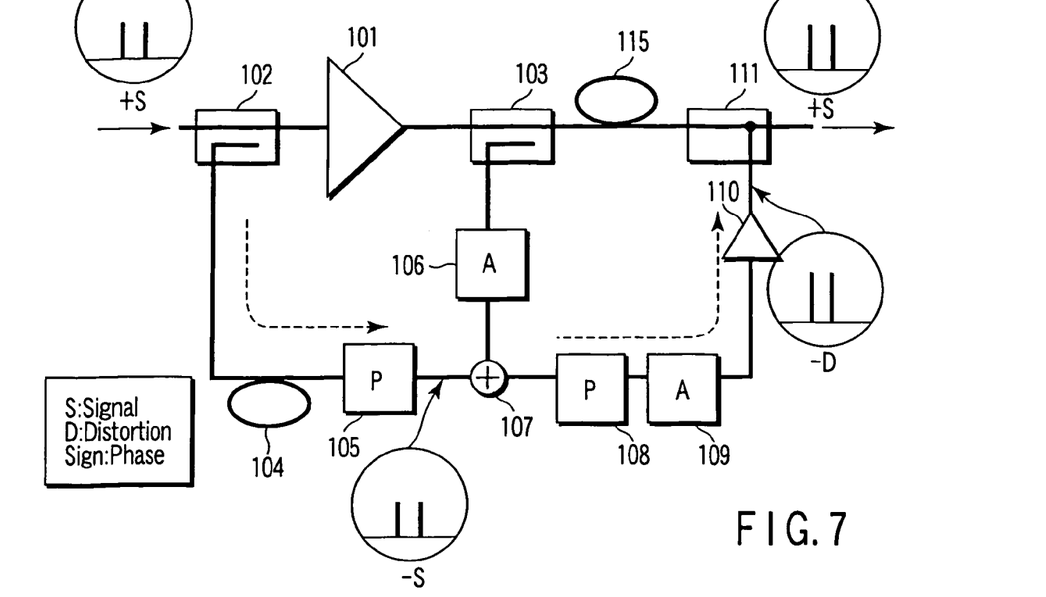
FIG. 7 illustrates a further equivalent circuit used to explain the operation of the feedforward amplifier of FIG. 2.

FIG. 7 shows an equivalent circuit useful in explaining the operation of the power amplifier 33A assumed when a radio signal is transmitted at a low transmission power level corresponding to the small cell.

Assume, for example, that the main controller 10 has performed transmission power control in accordance with a change in the distance between the base station and mobile station, during amplification in each operation mode corresponding to the large, intermediate or small cell. At this time, the amplification control circuit 120 changes the amplification operation of the power amplifier 33A in accordance with the transmission power level of a radio signal.

For example, assume that during amplification in the operation mode corresponding to the large cell, the transmission power level is reduced, thereby causing the detection value of the detection circuit 116 to be lower than the threshold value corresponding to the large cell operation mode. At this time, the amplification control circuit 120 controls the power supply control circuit 121 to stop the supply of power to the error amplifier 110 so as to change the operation mode to that corresponding to the intermediate cell.

As a result, in the power amplifier 33A, the operation of the error amplifier 110 is stopped, and only the main amplifier 101 operates. This reduces the power consumption of the power amplifier 33A by the power required for operating the error amplifier 110.

Similarly, assume that during amplification in the operation mode corresponding to the intermediate cell, the transmission power level is reduced, thereby causing the detection value of the detection circuit 116 to be lower than the threshold value corresponding to the intermediate cell operation mode. At this time, the amplification control circuit 120 controls the power supply control circuit 121 to stop the supply of power to the main amplifier 101 and supply power to the error amplifier 110, so as to change the operation mode to that corresponding to the small cell. The control circuit 120 also controls the switches 112 and 113 so that their movable contacts are connected to the respective stationary contacts "b".

As a result, in the power amplifier 33A, the operation of the main amplifier 101 is stopped, and only the error amplifier 110 operates. This significantly reduces the power consumption of the power amplifier 33A by the power required for operating the main amplifier 101.

In contrast, assume, for example, that during amplification in the operation mode corresponding to the small cell, the transmission power level is increased, thereby causing the detection value of the detection circuit 116 to be higher than the threshold value corresponding to the intermediate cell operation mode. At this time, the amplification control circuit 120 controls the power supply control circuit 121 to start the supply of power to the main amplifier 101 and stop the supply of power to the error amplifier 110, so as to change the operation mode to that corresponding to the intermediate cell. The control circuit 120 also controls the switches 112 and 113 so that their movable contacts are connected to the respective stationary contacts "a".

As a result, the main amplifier 101 operates, and the radio signal amplified by the main amplifier 101 is transmitted. At this time, since the error amplifier 110 does not operate, the power consumption is reduced by the power required for operating the amplifier 110.

Similarly, assume that during amplification in the operation mode corresponding to the intermediate cell, the transmission power level is increased, thereby causing the detection value of the detection circuit 116 to be higher than the threshold value corresponding to the large cell operation mode. At this time, the amplification control circuit 120 controls the power supply control circuit 121 to supply power to both the main amplifier 101 and error amplifier 110, so as to change the operation mode to that corresponding to the large cell.

Accordingly, the input radio signal is amplified by the main amplifier 101, and coupled with a cancel signal generated by part of the feedforward circuit and error amplifier 110, using the directional coupler 111. The radio signal having its distortion component thus canceled is transmitted. Thus, while the level of interference to an adjacent or nearby channel is limited to the stipulated value or less, high-power radio transmission can be performed.

As described above, in the first embodiment, the amplification control circuit 120 controls the power supply control circuit 121 in accordance with the amplification operation mode designated by the main controller 10. That is, in the case of a large cell, the amplification control circuit 120 controls the power supply control circuit 121 to supply power to both the main amplifier 101 and error amplifier 110, and also controls the switches 112 and 113 so that their movable contacts are connected to the respective stationary contacts "a". In the case of an intermediate cell, the amplification control circuit 120 controls the power supply control circuit 121 to supply power to the main amplifier 101 and stop the supply of power to the error amplifier 110, and also controls the switches 112 and 113 so that their movable contacts are connected to the respective stationary contacts "a". Further, in the case of a small cell, the amplification control circuit 120 controls the power supply control circuit 121 to stop the supply of power to the main amplifier 101 and supply power to the error amplifier 110, and also controls the switches 112 and 113 so that their movable contacts are connected to the respective stationary contacts "b".

Figure 4:
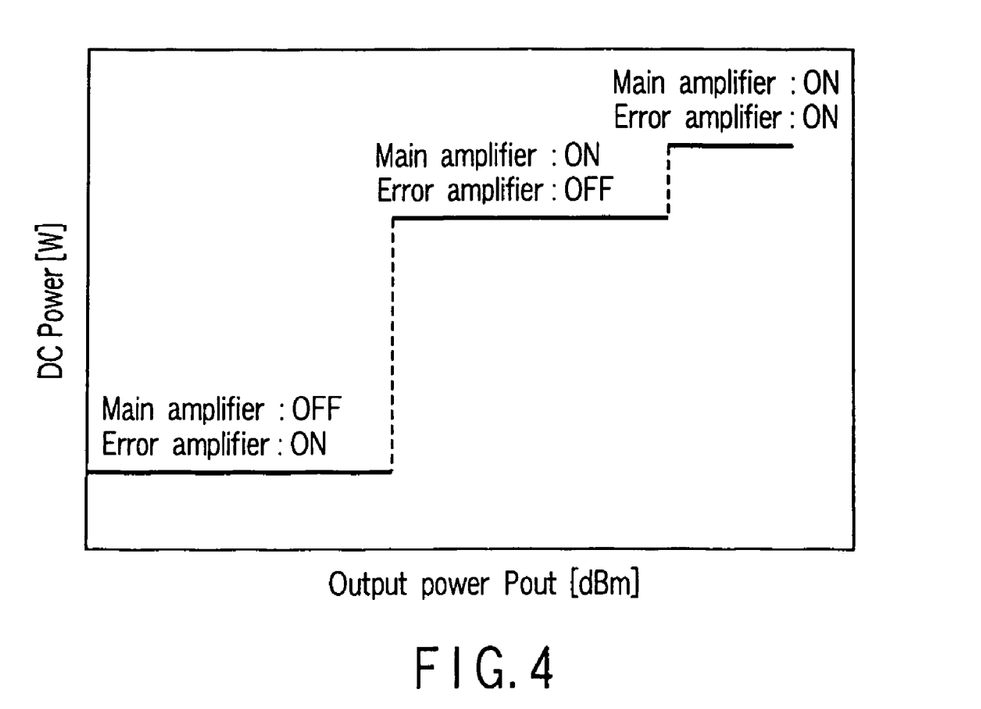
FIG. 4 is a view useful in explaining the power consumption reduction effect of the feedforward amplifier of FIG. 2.

Therefore, when a radio signal is transmitted to a large cell, the feedforward circuit enables transmission of a high-quality radio signal having its distortion component canceled. On the other hand, when a radio signal is transmitted to an intermediate cell, the error amplifier 110 is disabled, therefore the power consumption can be reduced by the power required for operating the error amplifier 110. When a radio signal is transmitted to a small cell, the main amplifier 101 is disabled and a radio signal amplified by the error amplifier 110 is transmitted. Therefore, the power consumption can be further reduced. FIG. 4 illustrates the relationship between the power consumption (DC power) [W] and the transmission output power Pout [dBm], obtained when the above-described amplification control is performed.

Further, in the first embodiment, when a radio signal is transmitted to a small cell, the switches 112 and 113 are connected to the bypass line 119, and the output of the error amplifier 110 is transmitted via the bypass line 119. Accordingly, the radio signal output from the error amplifier 110 is transmitted without being attenuated by the directional coupler 111, which makes it possible to lower the gain of the error amplifier 110, thereby further reducing the power consumption.

In addition, in the first embodiment, when transmission power control is performed during amplification in each operation mode corresponding to a large, intermediate or small cell, the amplification operation of the power amplifier 33A is changed in accordance with a change in transmission power level. Accordingly, an optimal amplification operation is always performed, resulting in effective reduction of the power consumption of the power amplifier 33A.

Figure 8:
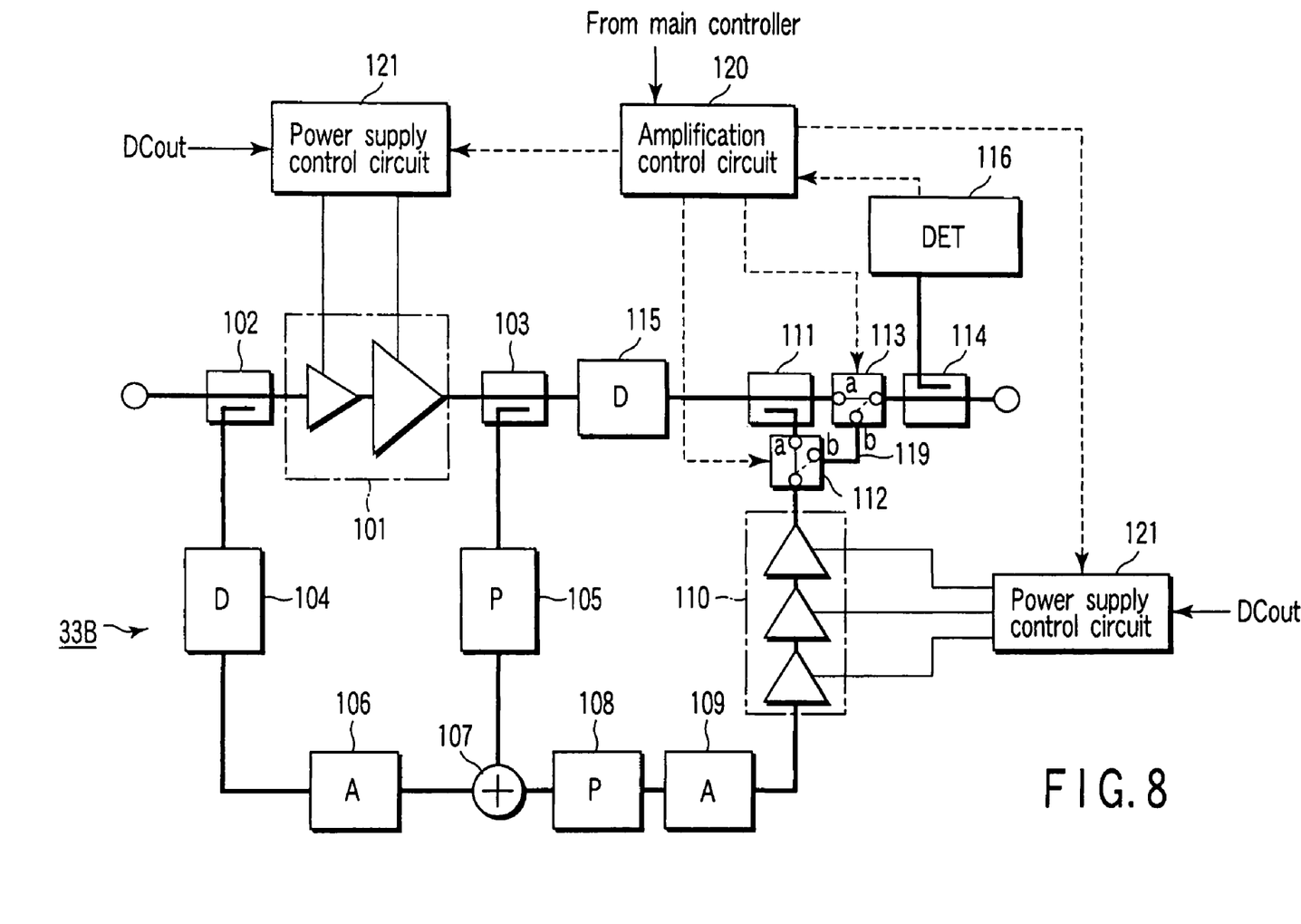
FIG. 8 is a block diagram illustrating a modification of the feedforward amplifier shown in FIG. 2.
Figure 9:
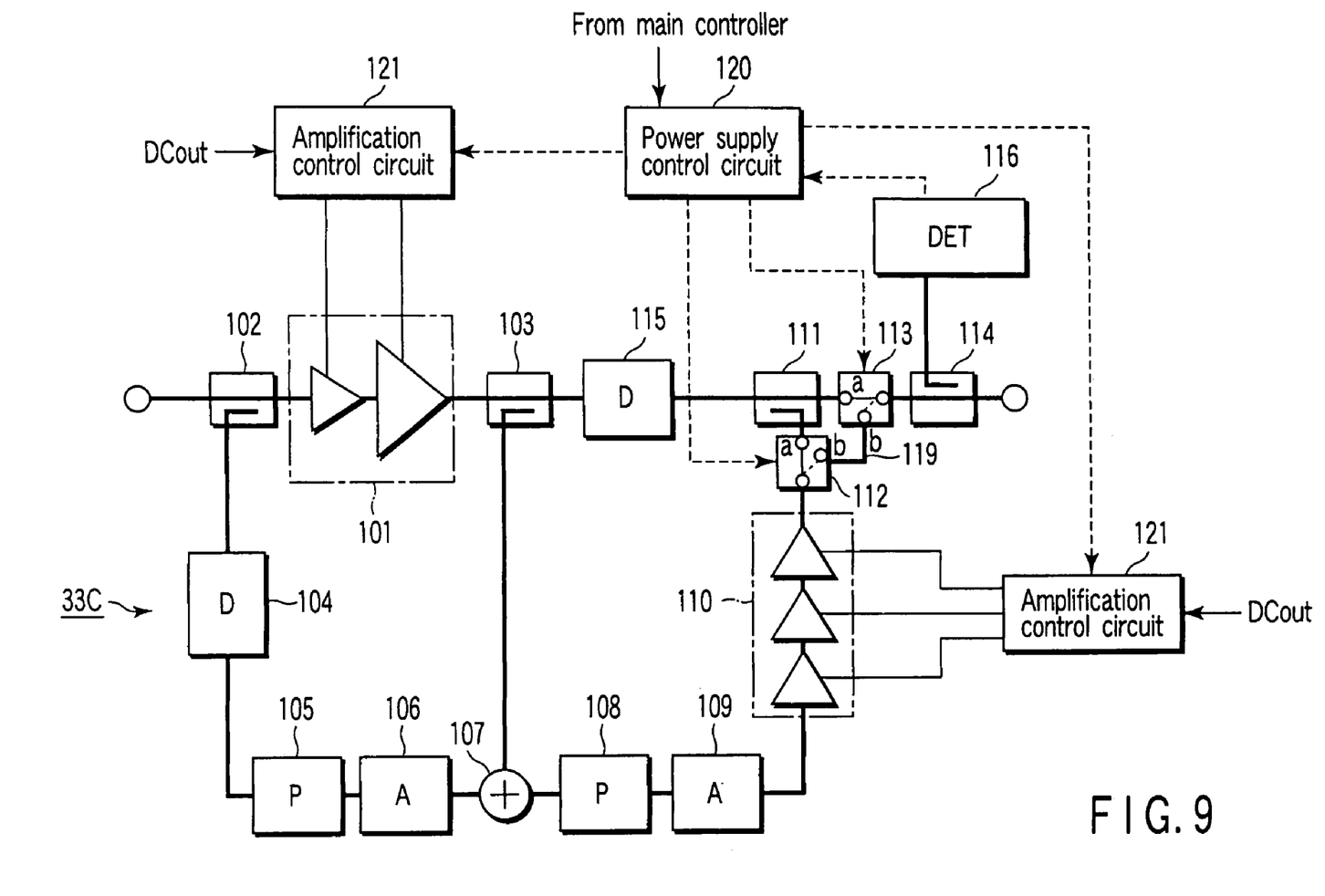
FIG. 9 is a block diagram illustrating another modification of the feedforward amplifier shown in FIG. 2.

The power amplifier 33A employed in the first embodiment can be modified as shown in FIGS. 8 and 9.

In the case of the power amplifier 33B shown in FIG. 8, in the main-signal cancel circuit unit of the feedforward circuit, the radio signal branched by a directional coupler 102 is delayed by a certain length of time by a delay circuit 104, and adjusted in amplitude by an amplitude adjusting circuit 106. On the other hand, the radio signal amplified by a main amplifier 101 is branched by a directional coupler 103 and phase-inverted by a phase adjusting circuit 105. The amplitude-adjusted signal is combined with the phase-adjusted signal by a synthesizer 107.

This configuration can also extract the distortion component contained in the radio signal output from the main amplifier 101.

Further, in the case of the power amplifier 33C shown in FIG. 9, in the main-signal cancel circuit unit of the feedforward circuit, the radio signal branched by a directional coupler 102 is delayed by a certain length of time by a delay circuit 104, phase-inverted by a phase adjusting circuit 105 and, adjusted in amplitude by an amplitude adjusting circuit 106. On the other hand, the radio signal amplified by a main amplifier 101 is branched by a directional coupler 103. The amplified signal is combined with the phase-inverted, amplitude-adjusted signal by a synthesizer 107.

This configuration can also extract the distortion component contained in the radio signal output from the main amplifier 101.

(Second Embodiment)

Figure 10:
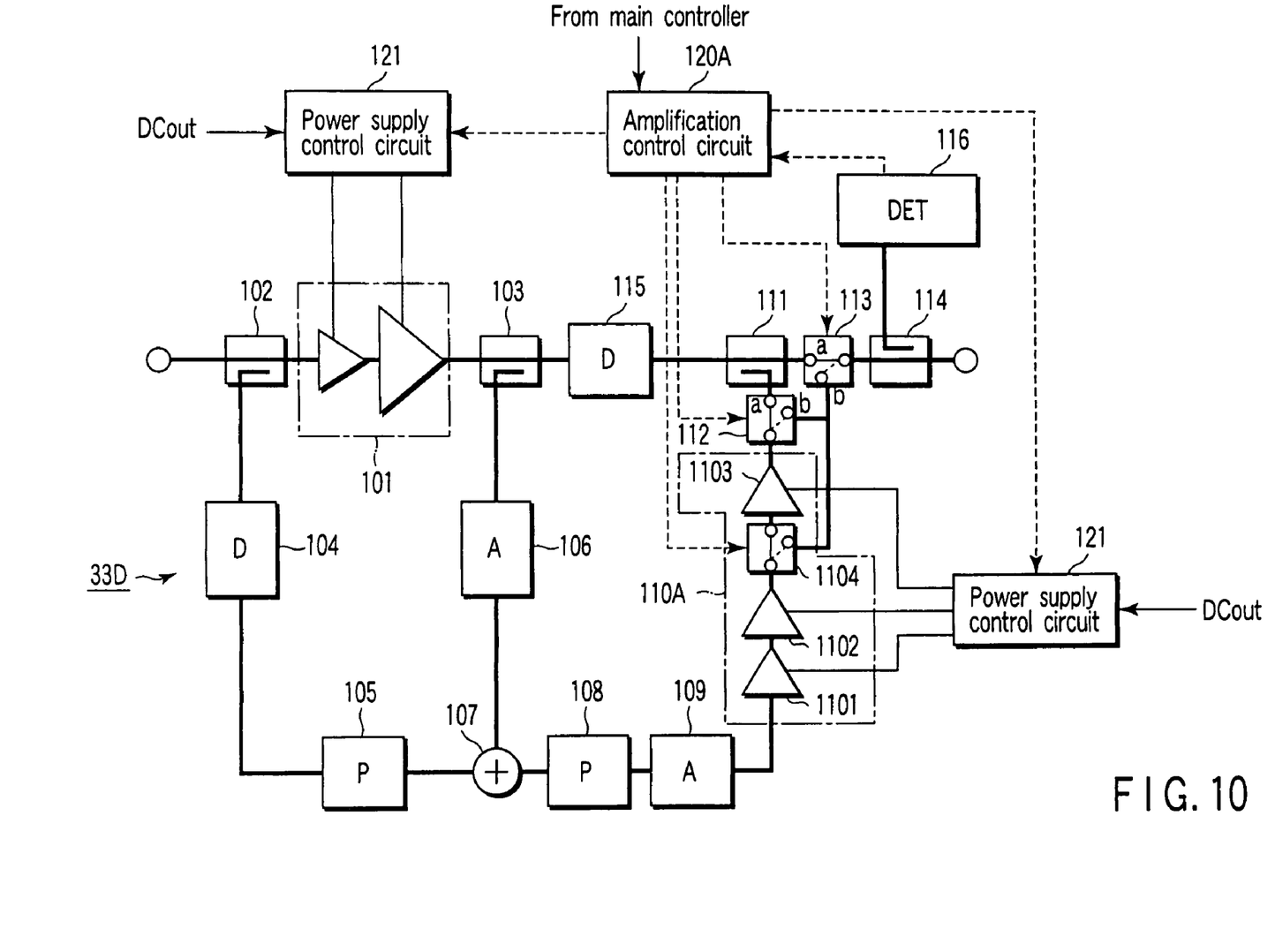
FIG. 10 is a block diagram illustrating a feedforward amplifier according to a second embodiment of the invention.

FIG. 10 is a block diagram illustrating a feedforward amplifier 33D according to a second embodiment of the invention. In FIG. 10, elements similar to those in FIG. 2 are denoted by corresponding reference numerals, and no detailed description is given thereof.

In the power amplifier 33D of this embodiment, an amplifier 110A having a plurality of amplifiers 1101, 1102 and 1103 is provided, and a switch (switch circuit) 1104 is provided in the error amplifier 110A for changing the number of connected amplifiers 1101–1103 in the amplifier 110A. An amplification control circuit 120A switches the switch 1104 to change the number of connected amplifiers 1101 to 1103.

By virtue of this configuration, the transmission power can be changed between two levels by changing the number of connected amplifiers 1101 to 1103, when a radio signal is transmitted with power corresponding to, for example, a small cell.

For example, when a radio signal is transmitted at a first transmission power level, the amplification control circuit 120A supplies a switch control signal to the switch 1104, thereby connecting the amplifiers 1102 and 1103. As a result, the error amplifier 110A serves as an amplifier formed of three amplifiers 1101 to 1103 connected in series, and outputs a radio signal amplified by the three amplifiers.

On the other hand, when a radio signal is transmitted at a second transmission power level lower than the first transmission power level, the amplification control circuit 120A supplies a switch control signal to the switch 1104, thereby connecting the amplifier 1102 to the switch 113. As a result, the error amplifier 110A serves as an amplifier formed of two amplifiers 1101 and 1102, and transmits a radio signal that is amplified by the two amplifiers and therefore has a transmission power level lower than a radio signal amplified by the three amplifiers.

This configuration enables respective transmission power levels to be set for small cells of different diameters without preparing a variable gain amplifier or attenuator. If, for example, the gain of each amplifier 1101, 1102 or 1103 is 10 dB, transmission power levels that has a power difference corresponding to 10 dB can be set for two small cells of different diameters.

In the example of FIG. 10, the switch 1104 is interposed between the second and third amplifiers 1102 and 1103. However, the switch 1104 may be interposed between the first and second amplifiers 1101 and 1102. Alternatively, the switch 1104 may be interposed between each pair of adjacent ones of the amplifiers 1101, 1102 and 1103.

If the switch 1104 is interposed between the first and second amplifiers 1101 and 1102, the transmission power difference may be set to a value (e.g., 20 dB) corresponding to two amplifiers. On the other hand, if the switch 1104 may be interposed between each pair of adjacent ones of the amplifiers 1101, 1102 and 1103, any one or more of three transmission power levels, the difference between any adjacent power levels of which is 10 dB, can be selectively used. Further, if the number of amplifiers is increased and a switch is interposed between each pair of adjacent amplifiers, the transmission power can be controlled in a larger number of stages.

(Third Embodiment)

Figure 11:
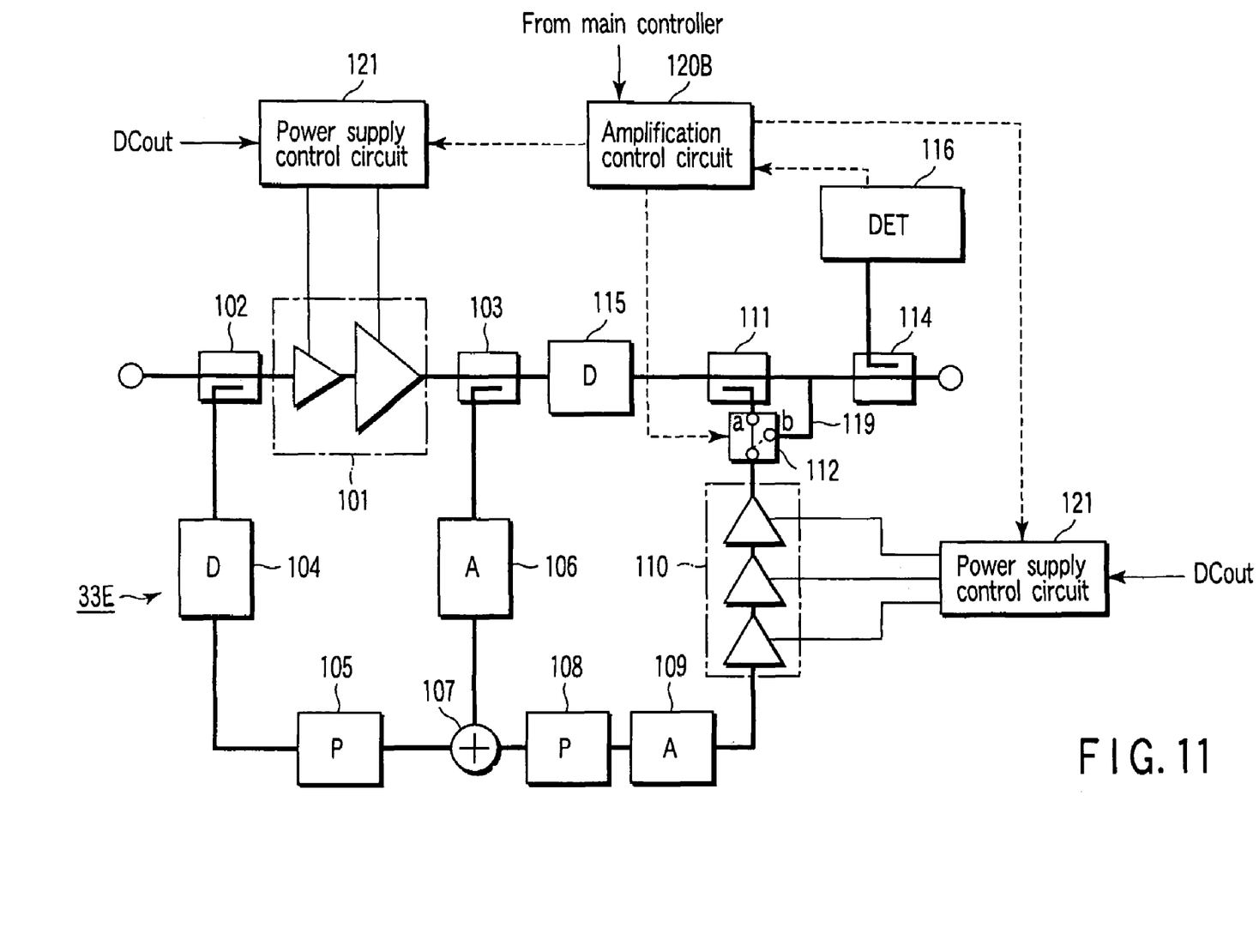
FIG. 11 is a block diagram illustrating a feedforward amplifier according to a third embodiment of the invention.

FIG. 11 is a block diagram illustrating a feedforward amplifier 33E according to a third embodiment of the invention. In FIG. 11, elements similar to those in FIG. 2 are denoted by corresponding reference numerals, and no detailed description is given thereof.

The feedforward amplifier 33E of the third embodiment differs from the first embodiment in that in the former, the bypass line 119 for bypassing the directional coupler 111 is directly connected to the radio signal line output without the switch 113. In the third embodiment, the length of the bypass line 119 is set to, for example, ¼ of the wavelength of a radio signal, in order to prevent impedance miss match from occurring in the radio signal output line, because of the bypass line 119 when the movable contact of the switch 112 is connected to the stationary contact "a".

Figure 12:
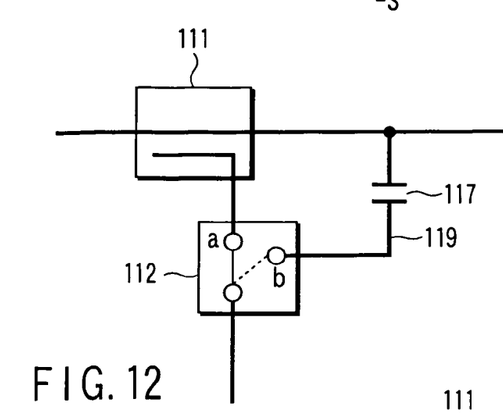
FIG. 12 illustrates an essential part of a modification of the feedforward amplifier shown in FIG. 11.
Figure 13:
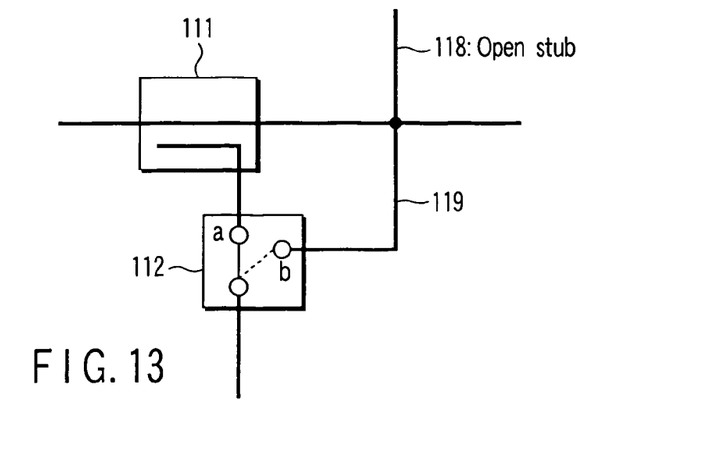
FIG. 13 illustrates an essential part of another modification of the feedforward amplifier shown in FIG. 11.

To prevent impedance miss match, a capacitor 117 may be provided across the bypass line 119 as shown in FIG. 12, or an open stub 118 may be provided at the junction between the bypass line 119 and radio signal output line as shown in FIG. 13.

The above-described configurations can dispense with the switch 113, thereby reducing the number of required switch circuit components and the circuit size, and simplifying the circuit structure. Further, attenuation of a signal due to impedance miss match can be minimized.

(Other Modifications)

In the first embodiment, the operation state of the power amplifier 33A can be varied in accordance with the diameters of large, intermediate and small cells, as illustrated in FIG. 3. However, the operation state of the power amplifier 33A may be varied in accordance with two cells, e.g., the large and small cells, or the intermediate and small cells. In any case, for the small cell, the main amplifier 101 is set in the OFF state, the error amplifier. 110 is set in the ON state, and the movable contacts of the switches 112 and 113 are connected to the stationary contacts "b".

Further, in the first embodiment, the operation state of the power amplifier 33A is set in accordance with the diameter of the cell covered by a base station when, for example, the base station is installed. However, the invention is not limited to this. Instead, the operation state of the power amplifier 33A may not be changed in accordance with the cell size, but be changed in accordance with open-loop control performed in accordance with a change in the distance between the base station and a mobile station.

Furthermore, in the first embodiment, the amplification control circuit 120 incorporated in the power amplifier 33A controls the main amplifier 101, error amplifier 110 and switches 112 and 113 under the control of the main controller 10 of the baseband circuit 1. However, the embodiment is not limited to this, but may be modified such that the power amplifier 33A does not incorporate the amplification control circuit 120, and the main controller 10 of the baseband circuit 1 directly controls the main amplifier 101, error amplifier 110 and switches 112 and 113.

Also, the first embodiment is directed to a radio communication apparatus provided in a base station for a mobile communication system, but may be directed to a radio communication apparatus provided in a mobile station. In general, mobile stations are powered by a battery. If the embodiment is applied to a mobile station, the operating time of the battery can be significantly increased.

Moreover, in each embodiment, although the bypass line 119 is employed to bypass the directional coupler 111, the bypass line 119 and switches 112 and 113, which are used to bypass the directional coupler 111, can be omitted if a directional coupler of a small attenuation is usable.

In addition, each embodiment is directed to a radio communication apparatus that employs CDMA as a radio access scheme, and a feedforward amplifier used in the apparatus. However, the invention is also applicable to a radio communication apparatus that employs frequency-division multiple access (FDMA), time-division multiple access (TDMA) or orthogonal frequency-division multiplexing (OFDM), and a feedforward amplifier used in the apparatus.

Although in each embodiment, the feedforward amplifier is used as a power amplifier, it can be used as another type amplifier according to purpose. Further, the configuration and/or radio access scheme of the radio communication apparatus, the configuration of the feedforward amplifier, the control procedure and contents of the amplification control circuit may be modified in various ways without departing from the scope of the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier comprising:
   a first amplifier circuit which amplifies a first signal to output an amplified first signal;
   a circuit which outputs a second signal corresponding to a difference between the first signal and the amplified first signal;
   a second amplifier circuit which amplifies the second signal to output an amplified second signal;
   a combine circuit which outputs an amplified signal by combining the amplified second signal with the amplified first signal; and
   a controller which controls a supply of a power to the first amplifier circuit and the second amplifier circuit and has a first mode to supply the power to the second amplifier circuit without supplying the power to the first amplifier circuit.

2. The amplifier according to claim 1, wherein the controller has a second mode to supply the power to the first amplifier circuit without supplying the power to the second amplifier circuit and has a third mode to supply the power to the first amplifier circuit and the second amplifier circuit.

3. The amplifier according to claim 2, wherein the controller selects one of the first mode, the second mode and the third mode in accordance with an output level of the amplified signal.

4. The amplifier according to claim 1, wherein the controller includes:
   an acquisition unit configured to acquire a control signal which designates an output level of the amplified signal; and
   a supply unit configured to supply the power to the second amplifier circuit without supplying the power to the first amplifier circuit in accordance with the output level.

5. The amplifier according to claim 1, wherein the controller includes:
   a detection unit configured to detect an output level of the amplified signal; and
   a supply unit configured to supply the power to the second amplifier circuit without supplying the power to the first amplifier circuit if the output level is less than a preset threshold value.

6. The amplifier according to claim 1, wherein the second amplifier circuit includes a plurality of amplifiers connected series and the number of connected ones of the plurality of amplifiers is changeable.

7. A radio communication apparatus comprising:
   an antenna; and
   a radio unit configured to supply, to the antenna, a signal output from the amplifier according to claim 1, the radio unit including the amplifier.

8. An amplifier comprising:
   a first amplifier circuit which amplifies a first signal to output an amplified first signal;
   a circuit which outputs a second signal corresponding to a difference between the first signal and the amplified first signal;
   a second amplifier circuit which amplifies the second signal to output an amplified second signal;
   a combine circuit which outputs an amplified signal by combining the amplified second signal with the amplified first signal; and
   a controller which controls a supply of a power to the first amplifier circuit and the second amplifier circuit and has a first mode to supply the power to the second amplifier circuit without supplying the power to the first amplifier circuit,
   wherein the amplified signal is selected and outputted from a group of the amplified first signal, the amplified second signal and a signal reduced a distortion component from the amplified first signal by using the amplified second signal.

9. The amplifier according to claim 8, wherein the amplified signal is selected in accordance with an output level of the amplified signal.

10. The amplifier according to claim 8, wherein the amplified signal is selected in accordance with a mode selected by the controller which has a second mode to supply the power to the first amplifier circuit without supplying the power to the second amplifier circuit and has a third mode to supply the power to the first amplifier circuit and the second amplifier circuit.

11. The amplifier according to claim 8, wherein the combine circuit includes
   a coupler which combines the amplified second signal with the amplified first signal; and
   a selecting circuit which selects and outputs one of a signal output from the coupler and the amplified second signal which bypasses the coupler.

12. The amplifier according to claim 11, wherein the coupler outputs the amplified first signal if the second amplifier circuit fails to be supplied with the power.

13. The amplifier according to claim 11, wherein the selecting circuit selects the amplified second signal which bypasses the coupler if the first amplifier circuit fails to be supplied with the power.

14. A radio communication apparatus comprising:
   an antenna; and
   a radio unit configured to supply, to the antenna, a signal output from the amplifier according to claim 8, the radio unit including the amplifier.

15. A feedforward amplifier comprising:
   a first amplifier circuit which amplifies a first signal to output an amplified first signal;
   a second amplifier circuit which amplifies a second signal to output an amplified second signal, the second signal corresponding to a difference between the first signal and the amplified first signal; and
   an output circuit which outputs an amplified signal selected from the amplified first signal, the amplified second signal and a combined signal reduced a distortion component from the amplified first signal by using the amplified second signal;
   wherein the feedforward amplifier has three operation modes comprised of a first mode to supply a power to the second amplifier circuit without supplying the power to the first amplifier circuit, a second mode to supply the power to the first amplifier circuit without supplying the power to the second amplifier circuit and a third mode to supply the power to the first amplifier circuit and the second amplifier circuit, and the output circuit outputs the amplified second signal in the first mode, the output circuit outputs the amplified first signal in the second mode and the output circuit outputs the combined signal in the third mode.

16. The amplifier according to claim 15, wherein each of the first mode, the second mode and the third mode is selected in accordance with an output level of the amplified signal.

17. A radio communication apparatus comprising:
   an antenna; and
   a radio unit configured to supply, to the antenna, a signal output from the feedforward amplifier according to claim 15, the radio unit including the amplifier.

* * * * *